United States Patent
Chien et al.

[19]

[11] Patent Number: 6,110,827
[45] Date of Patent: Aug. 29, 2000

[54] PLANARIZATION METHOD FOR SELF-ALIGNED CONTACT PROCESS

[75] Inventors: Sun-Chieh Chien, Hsinchu; Der-Yuan Wu, Taipei; Kun-Cho Chen, Taichung Hsien, all of Taiwan

[73] Assignee: United Microelectronics Corp., Hsinchu, Taiwan

[21] Appl. No.: 08/655,074

[22] Filed: Jun. 3, 1996

[30] Foreign Application Priority Data

Apr. 15, 1996 [TW]  Taiwan ................................. 85104463

[51] Int. Cl.[7] .................................................... H01L 21/44
[52] U.S. Cl. ........................... 438/675; 438/631; 438/697; 438/699; 438/700; 438/702; 438/760; 438/740; 438/959
[58] Field of Search ..................................... 438/700, 702, 438/760, 740, 631, 697, 699, 959, 675

[56] References Cited

U.S. PATENT DOCUMENTS

| | | | |
|---|---|---|---|
| 4,954,459 | 9/1990 | Avanzino et al. ................... | 437/228 |
| 5,164,340 | 11/1992 | Chen et al. ........................... | 438/675 |
| 5,188,987 | 2/1993 | Ogino .................................. | 438/675 |
| 5,545,581 | 8/1996 | Armacost et al. ................... | 438/631 |

*Primary Examiner*—Dwayne C. Jones
*Assistant Examiner*—C. Delacroix-Muirheid
*Attorney, Agent, or Firm*—J.C. Patents; Jiawei Huang

[57] ABSTRACT

A planarization method for self-aligned contact process which is suitable for use in DRAM processing. Prior to the formation of the bottom terminal layer of the capacitor, the substrate surface is first planarized, thus avoiding stringer effects and related bridging problems arising from an undulating surface profile, during subsequent etching of the defined pattern. Also according to the method of this invention, by covering the silicon substrate that has MOS transistors laid on top with first a deposition of an oxide layer, then an etch discriminatory layer, and finally a planarization layer, a substrate with a smooth, plane surface is obtained.

27 Claims, 3 Drawing Sheets

6,110,827

PLANARIZATION METHOD FOR SELF-ALIGNED CONTACT PROCESS

BACKGROUND OF THE INVENTION

1. Field of the Invention

The invention relates in general to techniques for manufacturing memory integrated circuits, and more particularly to a planarization method for a self-aligned contact process which can avoid stringer effects that may result in bridging phenomena.

2. Description of the Related Art

A conventional DRAM manufacturing process makes use of a technique called self-aligned contact to reduce the layout area of memory components. FIG. 1A to 1C are cross-sectional views showing how, in conventional processing, the definition of a contact window in a self-aligned contact process is carried out. A DRAM component generally consists of a MOS transistor which acts as a switching element, and a capacitor which acts as a charge storage device. Both of these elements are fabricated on a silicon substrate 10. As shown in the drawings, a field oxide layer 11 acts as an insulating structure between separate memory components. A gate dielectric layer 12 is produced by thermal oxidation of the surface of silicon substrate 10 and the gate and the connecting wires, labelled as 13 and 14 respectively, are formed by etching away the same heavily implanted polysilicon layer. Capping oxide layer elements 15 and 16 separately cover the surfaces of the gate 13 and connecting wires 14, respectively. The capping oxide layers 15 and 16 are produced by thermal oxidation of the surface of the polysilicon layer. Source/drain terminals 17 are formed by the implantation of impurities in the silicon substrate 10. Sidewall spacers 18 are laid on opposite sidewalls of the gates 13 and connecting wires 14.

First, as shown in FIG. 1A, a layer of oxide 19 covering the whole surface of the substrate 10 is formed by deposition. Due to the unevenness of the base substrate layer, the surface of the oxide layer 19 also has an undulating profile. Next, a layer of photoresist material 100 is coated on the oxide layer 19, and by a photolithographic technique, the pattern for the contact windows is defined, providing two openings 110 and 120 as shown in FIG. 1B. Then, using the photoresist layer 100 as a mask, the oxide layer 19 is etched to expose the desired contacts to the source/drain terminals 17. Thereafter, the photoresist layer 100 is removed, thereby obtaining the cross-sectional configuration shown in FIG. 1C. Then, the capacitor of the DRAM component may be formed precisely at the points where the contact windows 110 and 120 are situated. Some of the basic steps in the capacitor formation process include first structurally forming the bottom terminal layer of the capacitor, followed by forming the dielectric layer on top of the bottom terminal layer, and then finally forming the top terminal layer on top of the dielectric layer.

Since in the conventional manufacturing process there is no prior planarization treatment before the stage where the bottom terminal layer of the capacitor is formed, generally the substrate surface undulates. This undulation is especially pronounced for regions such as the narrow groove between two connecting wires 14. Therefore it is easy, when etching the defined polysilicon layer to form the top and bottom terminal layers of the capacitor, to pick up stringer effects which lead to bridging phenomena. The conventional method for avoiding such stringer effects is to lengthen the etching time. However, this measure will reduce production efficiency. Further, if an additional flushing step is included in the etching process to avoid stringer effects, the reactive gases used, such as Cl and SF, will diminish the capacitor area.

SUMMARY OF THE INVENTION

It is therefore an object of the invention to provide a planarization method for self-aligned contact processes, so that just before the bottom terminal layer of the capacitor is defined, the substrate surface is first planarized, thus avoiding the stringer problem in subsequent processes.

To achieve the object mentioned above, a planarization method is provided for a self-aligned contact process, that is suitable for a silicon substrate with a MOS transistor already formed on a rough and uneven surface. The planarization method for self-aligned contact processes includes the first step of forming an oxide layer along the substrate surface. An etch discriminatory layer is then formed along the oxide layer surface and a planarization layer is formed above the etch discriminatory layer. The uneven surface is then filled to create a smooth plane surface and a contact window mask is formed above the planarization layer. Using the contact window mask as a cover, the planarization layer, the etch discriminatory layer, and the oxide layer are sequentially etched. The source/drain terminals of the MOS transistor are then exposed.

BRIEF DESCRIPTION OF THE DRAWINGS

These and other objects, features, and advantages of the invention will become apparent from the following detailed description of the preferred but non-limiting embodiments. The description is made with reference to the accompanying drawings in which.

DETAILED DESCRIPTION OF THE PREFERRED EMBODIMENTS

Figure 1A:
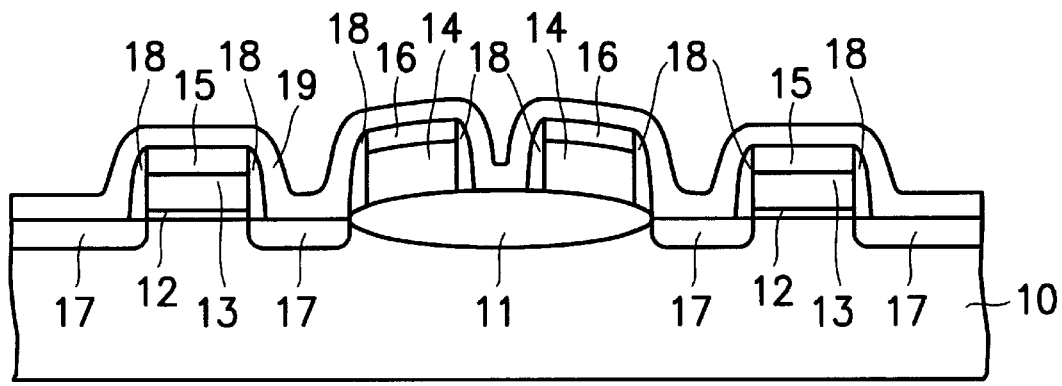
FIGS. 1A to 1C are cross-sectional views showing the process steps of the conventional self-aligned contact process for defining the contact windows.
Figure 1B:
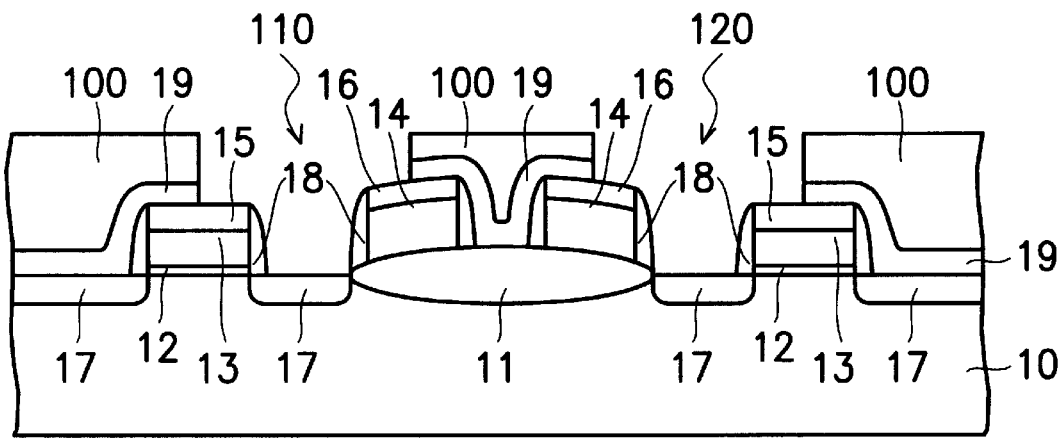
Figure 1C:
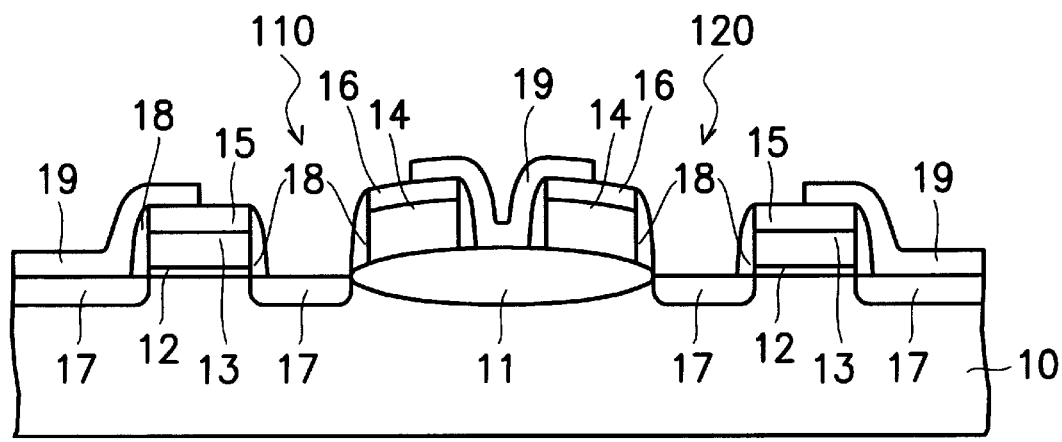

FIGS. 2A to 2D are cross-sectional views illustrating the preferred process steps according to the invention. Because a DRAM component includes a MOS transistor as a switching element, usually the MOS transistor is formed above a silicon substrate 20. Referring to FIGS. 2A to 2D, the field oxide layer 21 is formed by performing local oxidation of silicon (LOCOS) applied to the silicon substrate 20, and the field oxide layer 21 acts as an insulating structure between adjacent memory components. The gate dielectric layer 22 is formed by thermal oxidation of the surface of the silicon substrate 20. The gate 23 is composed of polysilicon material and is formed above the gate dielectric layer 22. Connecting wires 24 are also composed of polysilicon material and are formed together with the gate 23 when etching the same polysilicon layer. Capping oxide layer elements 25 and 26 separately cover the surfaces of gate 23 and connecting wires 24, respectively. The capping oxide layer is formed by thermal oxidation of the polysilicon surface. Source/drain terminals 27 are formed by doping impurities into the silicon substrate 20, and can have either a lightly doped drain (LDD) structure or a double diffusion drain (DDD) structure. Sidewall spacers 28 are placed at opposite sidewalls of the gate 23 and connecting wires 24.

Figure 2A:
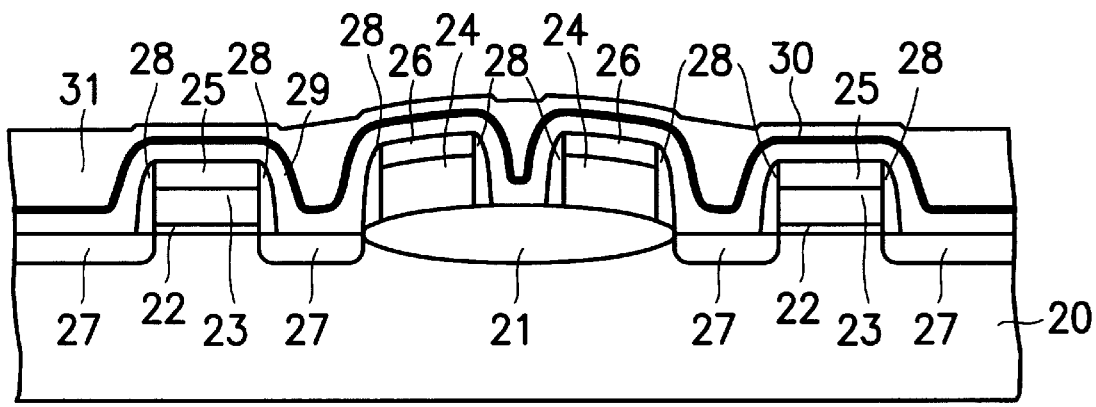
FIGS. 2A to 2D are cross-sectional views showing the preferred process steps according to the invention.

First, as shown in FIG. 2A, a layer of oxide 29 is deposited covering the entire substrate surface, to a thickness of about 500 Å to 3000 Å. Since the substrate structure already has an undulating surface, and the oxide layer 29 is formed on the surface above the base substrate, the surface of the oxide layer 29 itself also undulates. Next, an etch discriminatory layer 30 is deposited covering the oxide layer 29. The etch discriminatory layer 30 acts as an etching stop in the subsequent etching operation of the planarization layer 31 (details of which are described hereinbelow). Any material with high etch selectivity is suitable for use as the etch discriminatory layer 30. For example, the etch discriminatory layer 30 can be a silicon nitride layer with a thickness of between about 100 Å and about 500 Å.

Next, a planarization layer 31 is formed over the etch discriminatory layer 30, effectively forming a smooth top surface above the substrate. That is to say, during the planarization treatment, pits or hollows in the surface of the oxide layer 29 are filled in by the planarization layer 31 (for example, the groove formed between two adjacent connecting wires 24 will be filled up). For this reason, any material to be used as the planarization layer 31 must have the ability to fill up pits and hollows, and materials such as silicon oxide glass (SOG), borophosphosilicate glass (BPSG), borosilicate glass (BSG), or phosphosilicate glass (PSG) are all suitable choices. To ensure that the surface is properly planarized, the thickness of the planarization layer 31 should be between 1000 Å and 4000 Å.

Figure 2B:
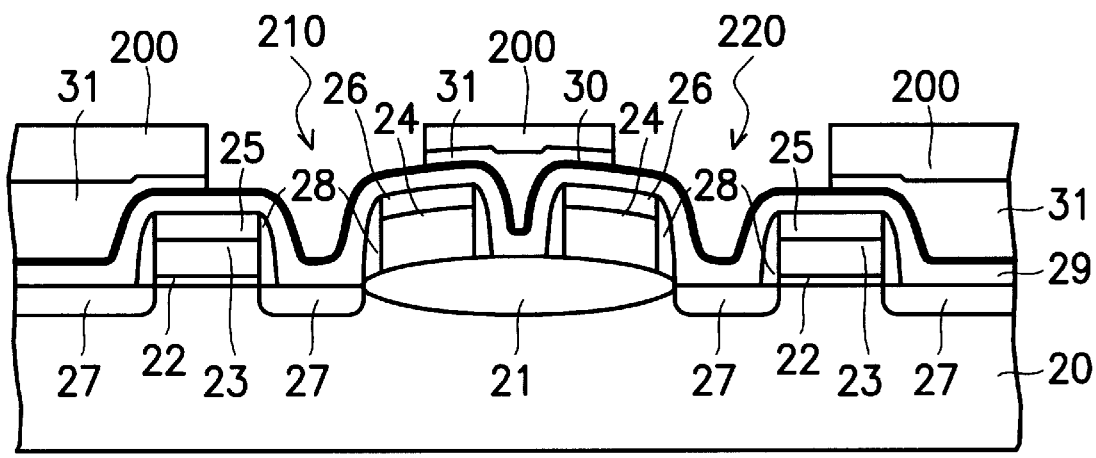

Thereafter, as shown in FIG. 2B, a layer of a photoresist material 200 is spin-coated on top of the planarization layer 31, and then through developing and fixing procedures, the contact window pattern is defined, forming two openings 210 and 220. Then, using the photoresist layer 200 as a mask, the portion of the planarization layer 31 that is above the openings 210 and 220 is etched away, thereby exposing the etch discriminatory layer 30 below. Because the top of the substrate surface is smoothed out after the formation of the planarization layer, there is a high degree of thickness variation in the vertical plane. Therefore, to etch away the planarization layer material positioned inside the openings 210 and 220, it is necessary to have the etch discriminatory layer 30 act as an etching stop, to utilize the etch selectivity property between the planarization layer 31 and the etch discriminatory layer 30. For example, if the materials used for the planarization layer 31 are oxide-containing compounds such as BPSG, BSG, PSG, or SOG, then the etch discriminatory layer 30 can be a nitride layer. Also, making use of the reactive gases employed in controlled plasma etching techniques, the etch selectivity between the oxide material and the silicon nitride materials will be further enhanced.

Figure 2C:
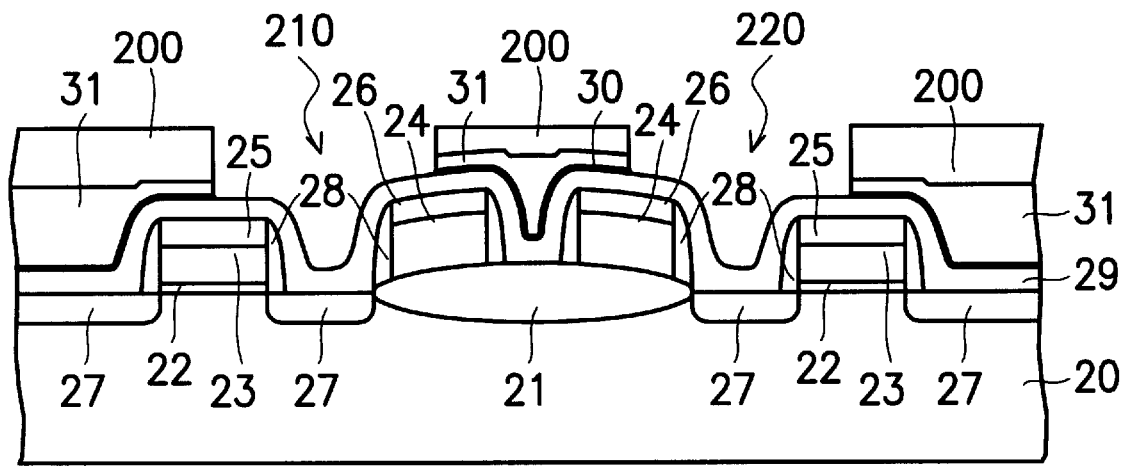
Figure 2D:
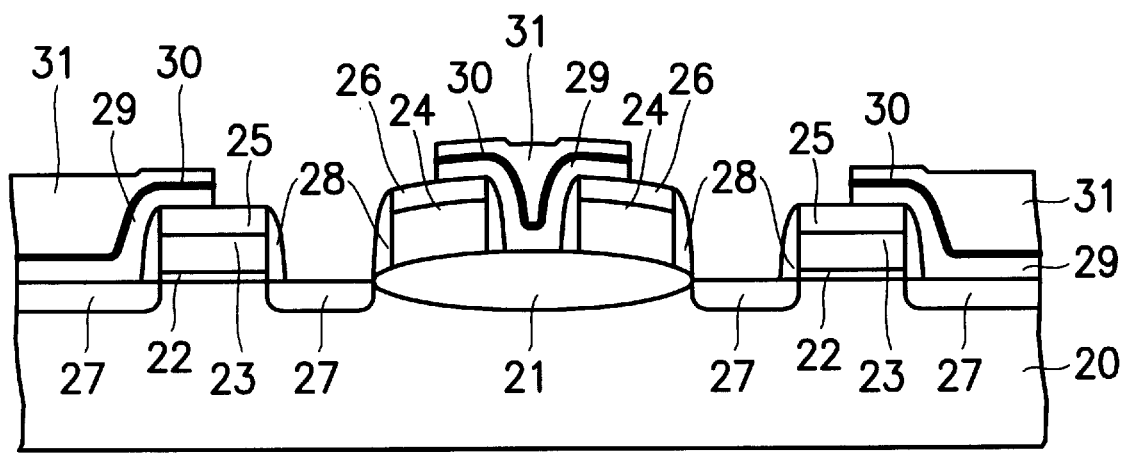

Similarly, again using the photoresist layer 200 as a mask, the etch discriminatory layer 30 inside the openings 210 and 220 may be etched away to expose the oxide layer 29 below. The cross-sectional configuration at this stage is shown in FIG. 2C. Next, the oxide layer 29 remaining inside the openings 210 and 220 is also etched away to expose the desired contact points for the source/drain terminals 27. Finally, the photoresist layer 200 is removed, and the cross-sectional configuration is as shown in FIG. 2D. A capacitor may then be formed in the contact openings by subsequent processing steps including forming the bottom terminal layer, then the middle dielectric layer, followed by the top terminal layer. Further details of the subsequent steps are not described herein.

Due to the specific substrate planarization treatment, as described and depicted in this invention, prior to the formation of the bottom terminal layer of the capacitor, subsequent processing problems due to stringer effects caused by poor step coverage will be avoided. Furthermore, according to the method of the invention, by covering the silicon substrate, including the preformed MOS transistors with, first a deposition of an oxide layer, then an etch discriminatory layer, and finally a planarization layer, a plane substrate surface is easily obtained.

While the invention has been described by way of example and in terms of a preferred embodiment, it is to be understood that the invention is not limited thereto. To the contrary, it is intended to cover various modifications and similar arrangements as would be apparent to those of skill in the art. The appended claims, therefore, should be accorded the broadest interpretation so as to encompass all such modifications and similar structures.

What is claimed is:

1. A planarization method for a self-aligned contact process suitable for use on a silicon substrate having a preformed MOS transistor that forms a construction having an uneven surface, the method comprising:

forming an oxide layer on and in conformance with the uneven surface;

forming an etch discriminatory layer on and in conformance with the oxide layer surface;

forming a planarization layer above the etch discriminatory layer, the planarization layer filling up the uneven surface and creating a smooth plane surface, wherein the oxide layer, the etch discriminatory layer and the planarization layer are formed in the above order;

forming a contact window mask above the planarization layer; and sequentially etching, using the contact window mask as a cover, first the planarization layer, then the etch discriminatory layer, followed by the oxide layer, to expose source/drain terminals of the MOS transistor.

2. A method according to claim 1, wherein forming an oxide layer includes forming an oxide layer having a thickness of between about 500 Å to about 3000 Å.

3. A method according to claim 1, wherein the etch discriminatory layer is silicon nitride.

4. A method according to claim 3, wherein the etch discriminatory layer is silicon nitride having a thickness of between about 100 Å and about 500 Å.

5. A method according to claim 1, wherein forming a planarization layer includes forming a planarization layer having a thickness of between about 1000 Å and about 4000 Å.

6. A method according to claim 5, wherein the planarization layer is a silicon oxide glass.

7. A method according to claim 5, wherein the planarization layer is a borophosphosilicate glass.

8. A method according to claim 5, wherein the planarization layer is a borosilicate glass.

9. A method according to claim 5, wherein the planarization layer is a phosphosilicate glass.

10. A method according to claim 1, wherein the MOS transistor includes a gate structure composed of a gate dielectric layer, a gate terminal on the gate dielectric layer, and an oxide layer cover on the gate terminal.

11. A planarization method for a self-aligned contact process suitable for use on a silicon substrate having a preformed MOS transistor that forms a construction having an uneven surface, the method comprising:

forming an oxide layer on and in conformance with the uneven surface;

forming an etch discriminatory layer on and in conformance with the oxide layer surface;

forming a planarization layer above the etch discriminatory layer, the planarization layer filling up the uneven surface and creating a smooth plane surface, wherein the oxide layer, the etch discriminatory layer and the planarization layer are formed in the above order; and etching into the planarization layer, the etch discriminatory layer, and the oxide layer, to expose source/drain terminals of the MOS transistor.

12. A method according to claim 11, wherein forming an oxide layer includes forming an oxide layer having a thickness of between about 500 Å to about 3000 Å.

13. A method according to claim 11, wherein the etch discriminatory layer is silicon nitride.

14. A method according to claim 13, wherein the etch discriminatory layer is silicon nitride having a thickness of between about 100 Å and about 500 Å.

15. A method according to claim 11, wherein forming a planarization layer includes forming a planarization layer having a thickness of between about 1000 Å and about 4000 Å.

16. A method according to claim 15, wherein the planarization layer is a silicon oxide glass.

17. A method according to claim 15, wherein the planarization layer is a borophosphosilicate glass.

18. A method according to claim 15, wherein the planarization layer is a borosilicate glass.

19. A method according to claim 15, wherein the planarization layer is a phosphosilicate glass.

20. A method according to claim 11, wherein the MOS transistor includes a gate structure composed of a gate dielectric layer, a gate terminal on the gate dielectric layer, and an oxide layer cover on the gate terminal.

21. A planarization method for a self-aligned contact process suitable for use on a silicon substrate having a preformed MOS transistor that forms a construction having an uneven surface, the method comprising:

forming an oxide layer on and in conformance with the uneven surface;

forming an etch discriminatory layer on and in conformance with the oxide layer surface, wherein a material of the etch discriminatory layer is different from a material of the oxide layer;

forming a planarization layer above the etch discriminatory layer, the planarization layer filling up the uneven surface and creating a smooth plane surface, wherein the oxide layer, the etch discriminatory layer and the planarization layer are formed in the above order, and a material of the etch discriminatory layer is different from a material of the planarization layer;

forming a contact window mask above the planarization layer; and sequentially etching, using the contact window mask as a cover, first the planarization layer, then the etch discriminatory layer, followed by the oxide layer, to form a contact opening which exposes source/drain terminals of the MOS transistor.

22. A method according to claim 21, wherein the etch discriminatory layer is silicon nitride.

23. A method according to claim 21, wherein the etch discriminatory layer is silicon nitride having a thickness of between about 100–500 angstroms.

24. A method according to claim 21, wherein the planarization layer is a silicon oxide glass.

25. A method according to claim 21, wherein the planarization layer is a borophosphosilicate glass.

26. A method according to claim 21, wherein the planarization layer is a borosilicate glass.

27. A method according to claim 21, wherein the planarization layer is a phosphosilicate glass.

* * * * *